(12) United States Patent
Jin et al.

(10) Patent No.: US 7,838,434 B2
(45) Date of Patent: *Nov. 23, 2010

(54) METHOD OF PLASMA ETCHING OF HIGH-K DIELECTRIC MATERIALS

(75) Inventors: Guangxiang Jin, San Jose, CA (US); Padmapani Nallan, San Jose, CA (US); Ajay Kumar, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/464,276

(22) Filed: Aug. 14, 2006

(65) Prior Publication Data

US 2007/0077767 A1 Apr. 5, 2007

Related U.S. Application Data

(63) Continuation of application No. 10/143,397, filed on May 9, 2002, now Pat. No. 7,094,704.

(51) Int. Cl.
*H01L 21/302* (2006.01)
(52) U.S. Cl. ............... 438/723; 438/706; 438/714; 216/80
(58) Field of Classification Search ........... 438/706, 438/710, 712, 714, 720, 723; 216/58, 68, 216/80
See application file for complete search history.

(56) References Cited

U.S. PATENT DOCUMENTS

| 5,071,714 A | 12/1991 | Rodbell et al. |
| 5,188,979 A | 2/1993 | Filipiak |
| 5,302,845 A | 4/1994 | Kumagai et al. |
| 5,337,207 A | 8/1994 | Jones et al. |
| 5,356,833 A | 10/1994 | Maniar et al. |
| 5,425,843 A * | 6/1995 | Saul et al. ............... 438/694 |
| 5,641,702 A * | 6/1997 | Imai et al. ............... 438/396 |
| 5,877,032 A | 3/1999 | Guinn et al. |
| 6,159,862 A * | 12/2000 | Yamada et al. ............... 438/712 |
| 6,184,072 B1 | 2/2001 | Kaushik et al. |
| 6,204,141 B1 | 3/2001 | Lou |
| 6,270,568 B1 | 8/2001 | Droopad et al. |
| 6,297,095 B1 | 10/2001 | Muralidhar et al. |
| 6,300,202 B1 | 10/2001 | Hobbs et al. |

(Continued)

FOREIGN PATENT DOCUMENTS

WO  WO-01/51072  7/2001

(Continued)

OTHER PUBLICATIONS

Vlsokay, et al., "Application of HfSiON as a gate dielectric material," Applied Physics Letters, 80 (17), 3183-3185, 2002.

(Continued)

*Primary Examiner*—Lan Vinh
(74) *Attorney, Agent, or Firm*—Alan Taboada; Moser IP Law Group

(57) ABSTRACT

A method of etching high dielectric constant materials using a halogen gas, a reducing gas and an etch rate control gas chemistry.

18 Claims, 4 Drawing Sheets

U.S. PATENT DOCUMENTS

| | | | |
|---|---|---|---|
| 6,309,982 B1 * | 10/2001 | Chooi et al. | 438/758 |
| 6,319,730 B1 | 11/2001 | Ramdani et al. | |
| 6,326,261 B1 | 12/2001 | Tsang et al. | |
| 6,348,386 B1 | 2/2002 | Gilmer | |
| 6,420,230 B1 | 7/2002 | Derderian et al. | |
| 6,429,091 B1 | 8/2002 | Chen et al. | |
| 6,451,665 B1 * | 9/2002 | Yunogami et al. | 438/397 |
| 6,531,390 B2 | 3/2003 | Chooi et al. | |
| 6,686,236 B2 | 2/2004 | Aggarwal et al. | |
| 6,707,086 B1 | 3/2004 | Jammy et al. | |
| 6,764,966 B1 * | 7/2004 | En et al. | 438/785 |
| 6,806,095 B2 | 10/2004 | Nallan et al. | |
| 6,835,665 B2 * | 12/2004 | Mise et al. | 438/706 |
| 6,984,591 B1 * | 1/2006 | Buchanan et al. | 438/778 |
| 7,094,704 B2 * | 8/2006 | Jin et al. | 438/710 |
| 2001/0044205 A1 * | 11/2001 | Gilbert et al. | 438/653 |
| 2001/0055852 A1 * | 12/2001 | Moise et al. | 438/396 |
| 2002/0006697 A1 * | 1/2002 | Kim et al. | 438/202 |
| 2002/0045282 A1 * | 4/2002 | Opsal et al. | 438/16 |
| 2002/0142488 A1 * | 10/2002 | Hong | 438/3 |

FOREIGN PATENT DOCUMENTS

WO     WO-01/97257     12/2001

OTHER PUBLICATIONS

Yee, et al., "Reactive radio frequency sputter deposition of higher nitrides of titanium, zirconium and hafnium," J. Vac. Sci. Technol. A 4 (3) May/Jun. 1986, 381-387.

* cited by examiner

400

| PROCESS OF THE PRESENT INVENTION UTILIZING A DPS CHAMBER ||||| 
|---|---|---|---|---|
| PARAMETER | UNITS | RANGE || SPECIFIC-EMBODIMENT |
| ^ | ^ | MIN | MAX | ^ |
| $Cl_2$ | SCCM | 20 | 300 | 20 |
| CO | SCCM | 2 | 200 | 20 |
| TOTAL PRESSURE | mTORR | 2 | 100 | 4 |
| ANTENNA POWER | WATTS | 200 | 2500 | 1100 |
| CATHODE POWER | WATTS | 0 | 100 | 0 |
| PEDESTAL TEMPERATURE | DEGREES CELSIUS | 100 | 500 | 350 |
| Ar | SCCM | 2 | 600 | 40 |
| $O_2$ | SCCM | 1 | 100 | 2 |

METHOD OF PLASMA ETCHING OF HIGH-K DIELECTRIC MATERIALS

CROSS-REFERENCE TO RELATED APPLICATIONS

This application is a continuation of U.S. patent application Ser. No. 10/143,397, filed May 9, 2002. The aforementioned related patent applications is herein incorporated by reference.

BACKGROUND OF THE INVENTION

1. Field of Invention

The present invention relates generally to a method of dry etching semiconductor wafers. More specifically, the invention relates to a method of etching high K dielectric materials using a gas mixture comprising a halogen gas and a reducing gas as well as an etch rate control gas.

2. Description of the Background Art

Field effect transistors that are used in forming integrated circuit generally utilize a polysilicon gate electrodes deposited upon a gate dielectric that separates the electrode from the channel between source and drain regions. In prior art transistor structures, the gate dielectric is typically fabricated of silicon dioxide ($SiO_2$). However, as integrated circuit transistors have become smaller (on the order of 100 nanometers in width), the thickness of the dielectric material in the gate structure has become thinner than 10 Angstroms. With such a thin dielectric, electrons can propagate from the polysilicon gate electrode into the transistor channel causing the transistor to operate improperly or become defective.

This leakage of electrons from the gate electrode through the gate oxide has led researchers to investigate the use of more stable high K dielectric materials. One very stable dielectric material having a high dielectric constant is hafnium-oxide ($HfO_2$). However, hafnium-oxide is such a stable dielectric material that it is very difficult to etch using conventional oxide etchants to form into gate structures without damaging other layers of material residing on the wafer. As such, hafnium-oxide has found limited use in semiconductor devices.

Therefore, there is a need in the art for a high K material etching process having very high selectivity to silicon-containing materials.

SUMMARY OF INVENTION

The disadvantages associated with the prior art are overcome by the present invention for etching materials with high dielectric constants (high K materials have a dielectric constant greater than 4.0) such as $HfO_2$, $ZrO_2$, $Al_2O_3$, BST, PZT, $ZrSiO_2$, $HFSiO_2$, $TaO_2$, and the like using a gas mixture comprising a halogen gas and reducing gas as well as an etch rate control gas. In one embodiment of the invention, an etch gas (or mixture) comprising chlorine ($Cl_2$), carbon monoxide (CO) and an etch rate control gas comprising at least one of argon (Ar) and oxygen ($O_2$) is used for etching hafnium-oxide films. In one example, the gas flow rates are in the range 20-300 sccm $Cl_2$, about 2-200 sccm CO, about 2-600 sccm Ar and about 1-100 sccm $O_2$ with a total chamber pressure in the range of 2-100 mTorr.

A decoupled plasma source etch reactor is illustratively used to practice one embodiment of the present invention. In general, the reactor uses an inductive source power of about 200-2500 W for plasma generation, and applies a cathode bias power of about 0-100 W to a wafer support pedestal. The reactor maintains the pedestal within a temperature range of about 100 to 500 degrees Celsius. The invention can be practiced, for example, by supplying to the reactor a combination of about 20 sccm of chlorine gas, about 20 sccm of carbon monoxide gas, about 40 sccm of argon and about 2 sccm of oxygen while maintaining a total chamber pressure of about 4 mTorr. The gas mixture is supplied to the reaction chamber wherein a plasma is formed and a hafnium-oxide layer is etched.

BRIEF DESCRIPTION OF THE DRAWINGS

The teachings of the present invention can be readily understood by considering the following detailed description in conjunction with the accompanying drawings, in which:

FIG. 4 is a table summarizing the processing parameters of one embodiment of the inventive method when practiced using the apparatus of FIG. 1.

To facilitate understanding, identical reference numerals have been used, where possible, to designate identical element that are common to the figures.

DETAILED DESCRIPTION

The present invention is a method of etching materials with high dielectric constants (high K materials have dielectric constants greater than 4.0) using a plasma generated from a gas (or gas mixture) comprising gases containing a halogen gas (such as $Cl_2$, HCl and the like), a reducing gas (such as carbon monoxide (CO), and an etch rate control gas (at least one of Ar or $O_2$) The high K materials include metal oxides such as $HfO_2$, $ZrO_2$, $Al_2O_3$, BST, PZT, $ZrSiO_2$, $HfSiO_2$, $TaO_2$, and the like. The type of halogen gas is selected to best remove the metal from the dielectric layer and the type of reducing gas is selected to best remove the oxygen from the dielectric layer. The argon is a dilutant and the oxygen reacts with the carbon to form a carbonate. The argon dilutant aids in controlling the etch process by slowing the etch rate below 100 Å/min. Without an etch rate control gas, the etch rate can be more than 200 Å/min. Such etch rate control is especially important when etching thin dielectric layers, e.g., less than 30 Å. The addition of oxygen to the $Cl_2$/CO chemistry improves the etch rate uniformity. The addition of both Ar and $O_2$ provide control of both etch rate and etch rate uniformity. The etch process of the present invention can be reduced to practice in a Decoupled Plasma Source (DPS) Centura® etch system or a DPS-II etch system available from Applied Materials, Inc. of Santa Clara, Calif.

Figure 1:
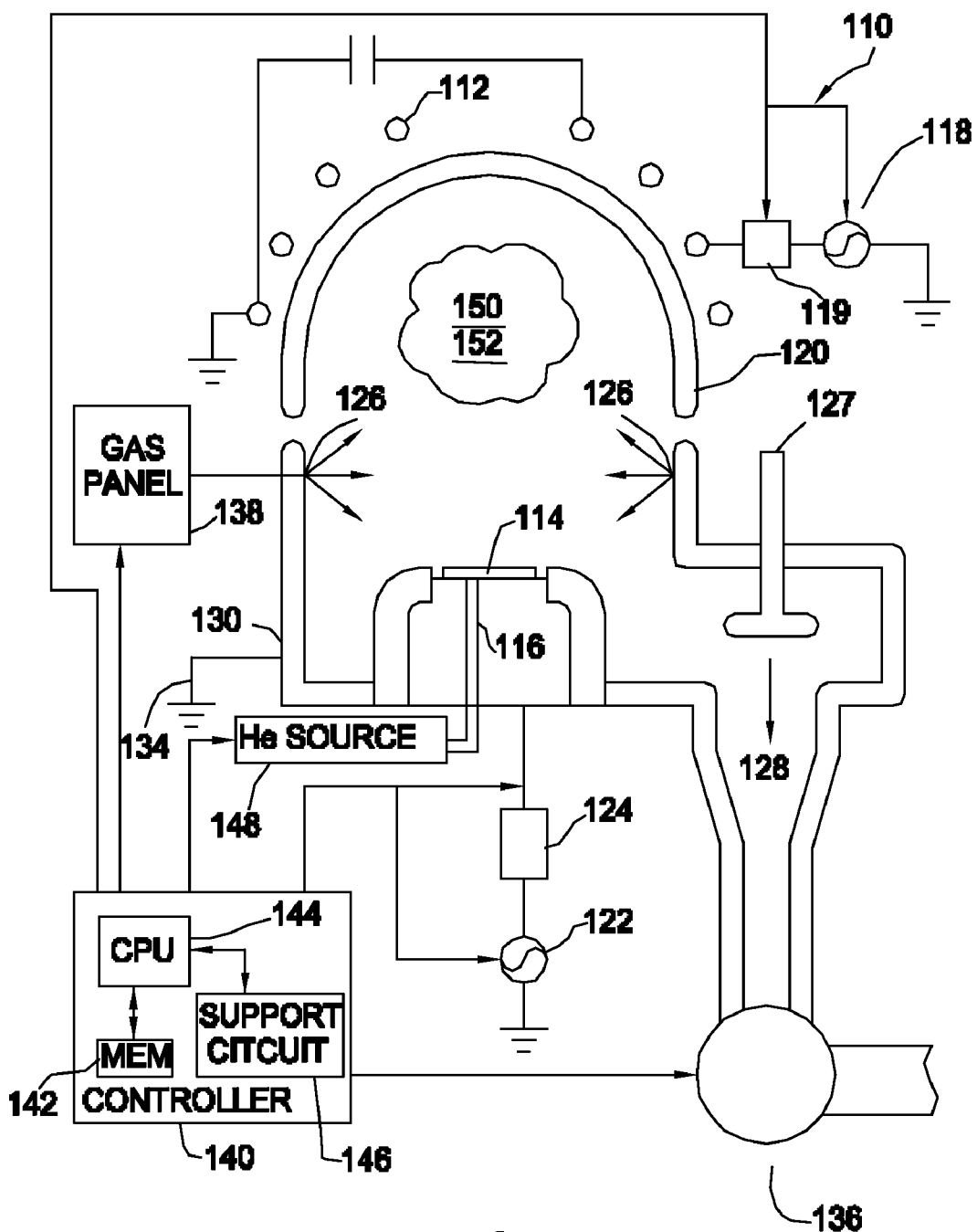
FIG. 1 depicts a schematic diagram of a plasma processing apparatus of the kind used in performing the etching processes according to one embodiment of the present invention.

FIG. 1 depicts a schematic diagram of the DPS etch process chamber 110, that comprises at least one inductive coil antenna segment 112, positioned exterior to a dielectric, dome-shaped ceiling 120 (referred to herein as the dome 120). Other chambers may have other types of ceilings, e.g., a flat ceiling. The antenna segment 112 is coupled to a radio-frequency (RF) source 118 (that is generally capable of producing an RF signal having a tunable frequency of about 12.56 MHz). The RF source 118 is coupled to the antenna 112 through a matching network 119. Process chamber 110 also includes a substrate support pedestal (cathode) 116 that is coupled to a second RF source 122 that is generally capable of producing an RF signal having a frequency of approximately 13.56 MHz. The source 122 is coupled to the cathode 116 through a matching network 124. The chamber 110 also contains a conductive chamber wall 130 that is connected to an electrical ground 134. A controller 140 comprising a central processing unit (CPU) 144, a memory 142, and support circuits 146 for the CPU 144 is coupled to the various components of the DPS etch process chamber 110 to facilitate control of the etch process.

In operation, the semiconductor substrate 114 is placed on the substrate support pedestal 116 and gaseous components are supplied from a gas panel 138 to the process chamber 110 through entry ports 126 to form a gaseous mixture 150. The gaseous mixture 150 is ignited into a plasma 152 in the process chamber 110 by applying RF power from the RF sources 118 and 122 respectively to the antenna 112 and the cathode 116. The pressure within the interior of the etch chamber 110 is controlled using a throttle valve 127 situated between the chamber 110 and a vacuum pump 136. The temperature at the surface of the chamber walls 130 is controlled using liquid-containing conduits (not shown) that are located in the walls 130 of the chamber 110.

The temperature of the substrate 114 is controlled by stabilizing the temperature of the support pedestal 116 and flowing helium gas from source 148 to channels formed by the back of the substrate 114 and grooves (not shown) on the pedestal surface. The helium gas is used to facilitate heat transfer between the pedestal 116 and the substrate 114. During the etch process, the substrate 114 is heated by a resistive heater within the pedestal to a steady state temperature and the helium facilitates uniform heating of the substrate 114. Using thermal control of both the dome 120 and the pedestal 116, the substrate 114 is maintained at a temperature of between 100 and 500 degrees Celsius.

The RF power applied to the inductive coil antenna 112 has a frequency between 50 kHz and 13.56 MHz and has a power of 200 to 2500 Watts. The bias power applied to the pedestal 116 may be DC or RF and is between 0 and 100 Watts. To improve etch selectivity and etch rate control, the bias power may be set to zero.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process 200 is generally stored in the memory 142 as a software routine 202. The software routine 202 may also be stored and/or executed by a second CPU (not shown) that is remotely located from the hardware being controlled by the CPU 144.

Figure 2:
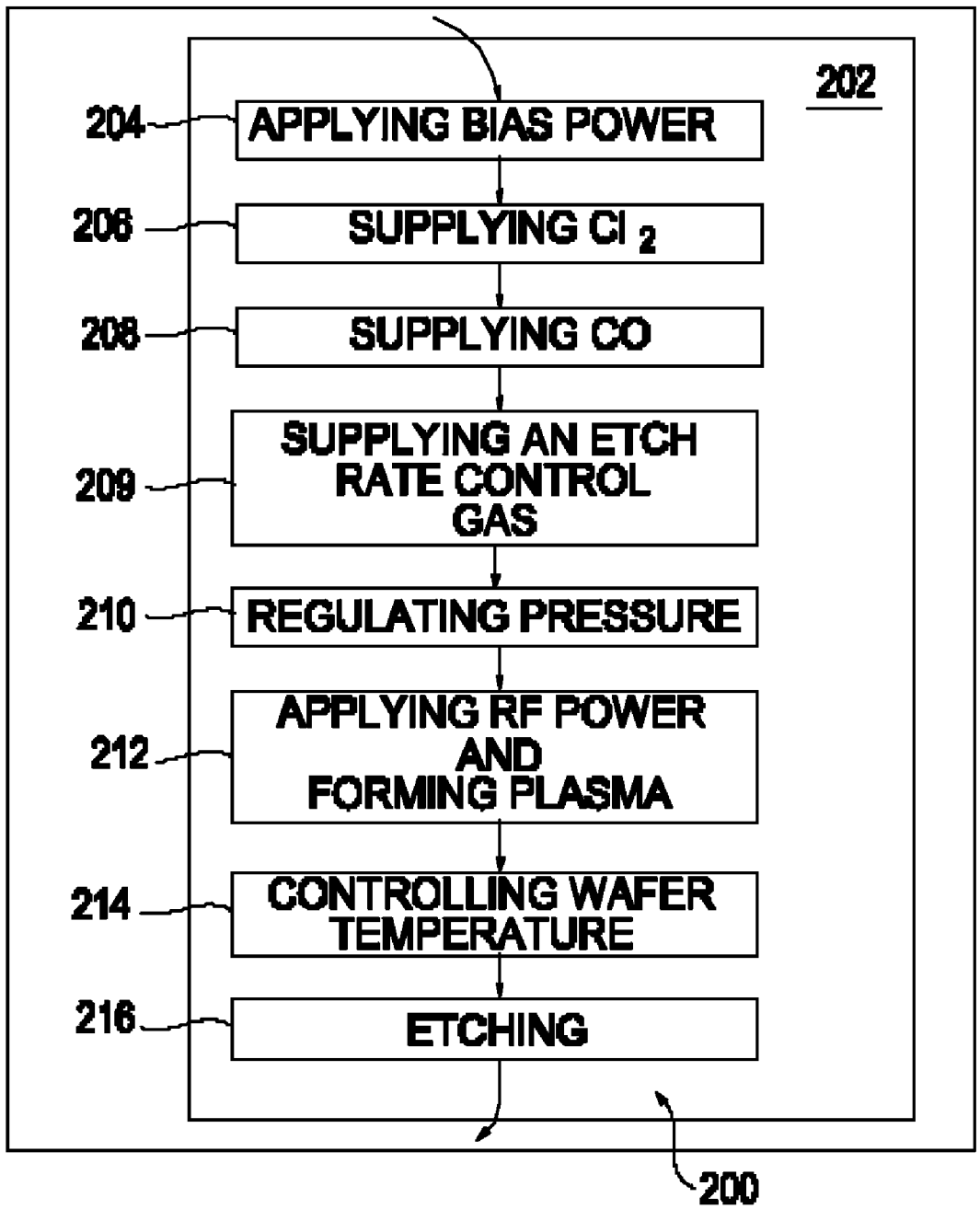
FIG. 2 depicts a flow diagram of an example of the inventive process.

The specific embodiment of the etching process 200 depicted in FIG. 2 comprises the steps of applying bias power to the pedestal (step 204), supplying gas containing chlorine (i.e., $Cl_2$) to the chamber 100 (step 206), supplying CO to the chamber 100 (step 208), supplying an etch rate control gas to the chamber 100 (step 209), regulating the pressure of the gases (step 210), applying RF power and forming a plasma (step 212), controlling the wafer temperature (step 214), and etching the silicon (step 216). The etching step 216 has a duration that continues until an unmasked portion of metal-oxide is removed. The etch time is terminated upon a certain optical emission occurring, upon a particular duration occurring or upon some other indicator determining that the metal-oxide has been removed.

The foregoing steps of the process 200 need not be performed sequentially. For example, some or all of the steps may be performed simultaneously to etch a hafnium-oxide or other high K dielectric layer.

The software routine 202 is discussed with respect to FIG. 1 and FIG. 2. The software routine 202 is executed after a wafer 114 is positioned on the pedestal 116. The software routine 202 when executed by the CPU 144, transforms the general purpose computer into a specific purpose computer (controller) 140 that controls the chamber operation such that the etching process 200 is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Continuing to refer to FIG. 1 and FIG. 2, a wafer or other form of workpiece 114 is etched, for example, by applying a bias power in the range of 0-100 Watts to the pedestal 116 in step 204. The gaseous mixture 150 is supplied to the chamber 110 at a rate in the range of 20-300 sccm $Cl_2$ and 2-200 sccm CO in steps 206 and 208, respectively. The mixture also comprises at least one of argon at a rate in the range of 2-600 sccm, or oxygen at a rate in the range of 1-100 sccm. In step 210, the total pressure of the gas mixture 150 is regulated to be maintained in the range of 2-100 mTorr.

Once the gas mixture 150 is present above the wafer 114, step 212 applies 200-2500 Watts of RF power to the antenna 112, and plasma 152 is formed. The wafer 114 is heated to 100-500 degrees Celsius in step 214. Etching of the wafer 114 occurs in step 216.

FIG. 4 presents a table 400 summarizing the etch process parameters through which one can practice the invention using a DPS Centura® system. The etch process parameters for the embodiment of the invention presented above are summarized in column 402. The process ranges are presented in column 404. It should be understood, however, that the use of a different chamber may necessitate different process parameter values and ranges.

One specific recipe for etching hafnium-oxide uses a cathode bias power of zero watts, 20 sccm of $Cl_2$, 20 sccm of CO, 40 sccm of $Ar_1$, 2 sccm of $O_2$, a chamber pressure of 4 mTorr, an antenna power of 1100 watts and a pedestal temperature of 350° C. This particular recipe results in an average etch rate of 88 Å/min. and an etch rate uniformity of 6%.

In another operative example, hafnium-oxide was etched using a mixture of 40 sccm of $Cl_2$, 40 sccm of CO, 2 sccm of $O_2$, a cathode bias of 0 watts, an antenna power of 1100 watts, a pedestal temperature of 350° C. and a chamber pressure of 4 mTorr. This particular recipe results in an average etch rate of 181 Å/min. and an etch rate uniformity of 4%.

In another operative example, hafnium-oxide was etched using a mixture of 20 sccm of $Cl_2$, 20 sccm of CO, 40 sccm of Ar, a cathode bias of 0 watts, an antenna power of 1100 watts, a pedestal temperature of 350° C. and a chamber pressure of 4 mTorr. This particular recipe results in an average etch rate of 65 Å/min. and an etch rate uniformity of 16%.

Figure 3A:
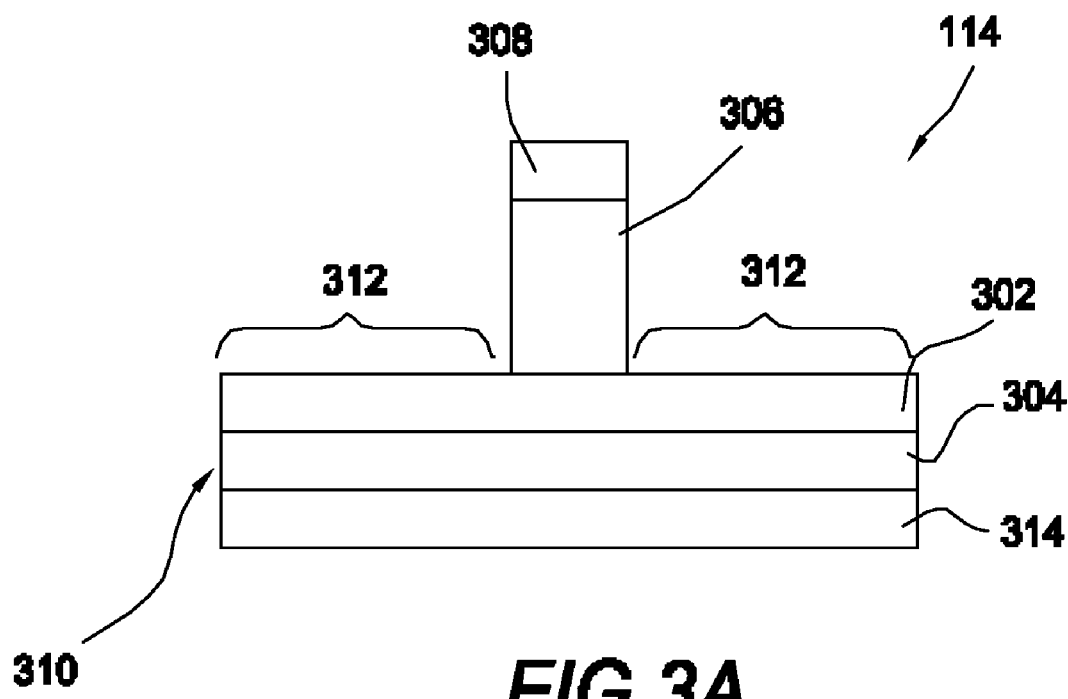
FIG. 3a depicts a schematic cross-sectional view of a wafer having a hafnium-oxide layer of the kind used in performing the etching processes according to an example of the present invention.

One illustrative embodiment of the inventive process is used for etching a wafer 114 containing a film stack 310 of FIG. 3a to form a gate structure of a transistor. The wafer 114 comprise a doped layer 314, a silicon dioxide layer 304 (optional), a high K dielectric layer 302, a polysilicon layer 306, and an etch mask 308. The film stack 310 comprises a layer of polysilicon 306 that has been previously etched to a form defined by the patterned photoresist mask 308. The photoresist 306 is patterned to leave a portion 312 of the high K dielectric layer 302 exposed to the etch chemistry. An underlying, optional silicon dioxide layer 304 will be conventionally etched after the high K dielectric in region 312 is removed. The $SiO_2$ layer generally forms during deposition of the metal-oxide dielectric as oxygen diffuses into the silicon of the wafer. The film stack 310 is deposited upon a wafer having a doped layer 314 that defines the channel of a transistor. In one embodiment where the high K dielectric material is hafnium-oxide, the hafnium-oxide is etched by the $Cl_2$/CO/Ar/$O_2$ chemistry at an average rate of about 88 Å/min with a selectivity to $SiO_2$ of greater than 60:1. The selectivity to silicon and polysilicon is greater than 3:1.

Figure 3B:
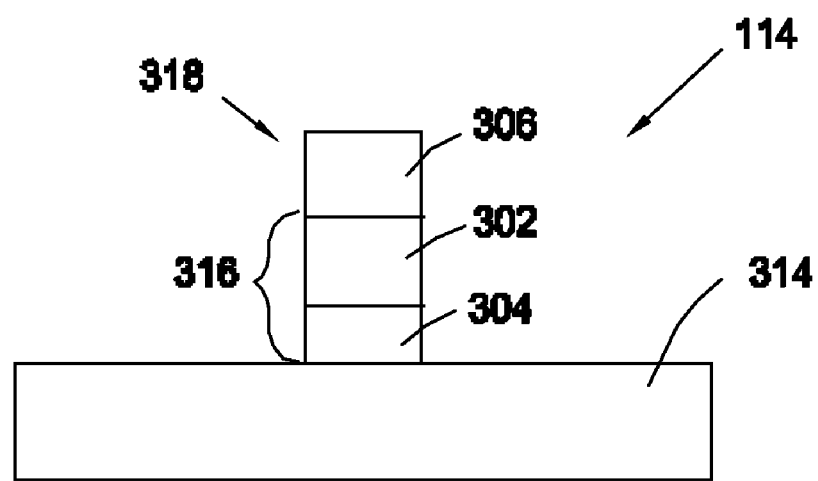
FIG. 3b depicts a schematic cross-sectional view of a gate structure comprising the hafnium-oxide layer of FIG. 3a that has been etched using an etching chemistry according to an example of the present invention.

The result of the inventive etching method is best appreciated by referring to a gate structure depicted in FIG. 3b. The profile illustrates a wafer 114 having the doped layer 314 that forms the channel of a transistor and a gate stack 318. The gate stack 318 comprises a gate dielectric 316 and a gate electrode 306. The gate electrode comprises a polysilicon layer and the gate dielectric 316 comprises a high K dielectric layer 302 on top of a silicon dioxide layer 304. The high K dielectric layer ensures that, during transistor operation, electrons will not flow from the gate electrode to the channel. As such, the gate dielectric can be made very thin, e.g., about 5 nm. At 5 nm, the silicon dioxide layer is 2 nm thick and the high K dielectric layer is 3 nm thick. Alternatively, the $SiO_2$ layer may not be present and the high K dielectric layer may reside between the channel and the polysilicon layer.

The invention may be practiced in other etching equipment wherein the processing parameters may be adjusted to achieve acceptable etch characteristics by those skilled in the arts by utilizing the teachings disclosed herein without departing from the spirit of the invention.

What is claimed is:

1. A method of plasma etching a layer of dielectric material, comprising:
    etching a layer of dielectric material comprising at least one of $HfO_2$, $ZrO_2$, $ZrSiO_2$, and $HfSiO_2$ using a plasma formed from a gas mixture comprising CO, a chlorine containing gas and $O_2$.

2. The method of claim 1, wherein the gas mixture comprises CO, a chlorine containing gas, Ar, and $O_2$.

3. The method of claim 1, wherein the layer comprises one of $HfO_2$ or $HfSiO_2$.

4. The method of claim 1, wherein the chlorine containing gas is $Cl_2$.

5. The method of claim 1, further comprising the step of:
    maintaining a gas pressure of between 2-100 mTorr while etching the layer of dielectric material.

6. The method of claim 1, further comprising the step of:
    applying a bias power of up to 100 W to a cathode pedestal while etching the layer of dielectric material.

7. The method of claim 1, further comprising the step of:
    applying a bias power of 0 W to a cathode pedestal while etching the layer of dielectric material.

8. The method of claim 1, further comprising the step of:
    applying a power of 200 to 2500 W to an inductively coupled antenna while etching the layer of dielectric material.

9. The method of claim 1, further comprising the step of:
    maintaining a workpiece containing said layer at a temperature between 100 to 500 degrees Celsius while etching the layer of dielectric material.

10. A computer-readable medium containing software that when executed by a computer causes an etch reactor to etch a layer of dielectric material using a method comprising:
    etching a layer of dielectric material comprising at least one of $HfO_2$, $ZrO_2$, $ZrSiO_2$, and $HfSiO_2$ using a plasma formed from a gas mixture comprising CO, a chlorine containing gas and $O_2$.

11. The computer-readable medium of claim 10, wherein the gas mixture comprises CO, a chlorine containing gas, Ar, and $O_2$.

12. The computer-readable medium of claim 10, wherein the layer comprises at least one of $HfO_2$ or $HfSiO_2$.

13. The computer-readable medium of claim 10, wherein the chlorine containing gas is $Cl_2$.

14. A method of plasma etching a layer of dielectric material, comprising:
    etching a layer of dielectric material comprising at least one of $HfO_2$ or $HfSiO_2$ using a plasma comprising CO, a chlorine containing gas and $O_2$.

15. The method of claim 14, wherein the chlorine containing gas is $Cl_2$.

16. The method of claim 14, wherein the plasma comprises CO, a chlorine containing gas, Ar, and $O_2$.

17. A method of plasma etching a layer of dielectric material, comprising:
    etching a layer of dielectric material comprising at least one of $HfO_2$, $ZrO_2$, $Al_2O_3$, $ZrSiO_2$, $HfSiO_2$, and $TaO_2$ using a plasma formed from a gas mixture comprising CO, a chlorine containing gas, and $O_2$.

18. The method of claim 17, wherein the gas mixture further comprises argon.

* * * * *